United States Patent [19]

Kameyama et al.

[11] Patent Number: 5,034,791
[45] Date of Patent: Jul. 23, 1991

[54] FIELD EFFECT SEMICONDUCTOR DEVICE AND ITS MANUFACTURING METHOD

[75] Inventors: Shuichi Kameyama, Itami; Atsushi Hori, Moriguchi, both of Japan

[73] Assignee: Matsushita Electric Industrial Co., Ltd., Kadoma, Japan

[21] Appl. No.: 607,889

[22] Filed: Nov. 1, 1990

[30] Foreign Application Priority Data

Nov. 1, 1989 [JP] Japan ................................ 1-286816

[51] Int. Cl.[5] ..................... H01L 29/78; H01L 21/265
[52] U.S. Cl. .................................. 357/23.9; 357/23.4; 357/59; 357/68; 357/67; 357/71; 437/29; 437/41

[58] Field of Search .................. 357/23.4, 23.9, 59, 357/67, 68, 71; 437/29, 41

[56] References Cited

U.S. PATENT DOCUMENTS 4,920,391  4/1990  Uchida ........................ 357/23.4

Primary Examiner—Edward J. Wojciechowicz
Attorney, Agent, or Firm—Ratner & Prestia

[57] ABSTRACT

In a semiconductor integrated circuit device using a field effect transistor, such as MOS, having the end part of the drain overlapped with the gate electrode, a novel gate-drain overlap structure of excellent performance and reliability is presented. A manufacturing method for this device is also presented.

18 Claims, 11 Drawing Sheets

FIELD EFFECT SEMICONDUCTOR DEVICE AND ITS MANUFACTURING METHOD

BACKGROUND OF THE INVENTION

The present invention relates to a field effect semiconductor device and a manufacturing method thereof. More particularly the present invention relates to a semiconductor device composed of field effect transistors for integrated circuits and a manufacturing method thereof suited to higher performance and higher reliability.

In the field of field effect devices using silicon semiconductors and including, for example, integrated circuits employing MOS transistors, the size of the constituent elements is becoming smaller and smaller. Thus, research and development is conducted in the region of submicrons. The structure and manufacturing method have improved but, for miniature elements (i.e. MOS) due to miniaturization, worsening of reliability due to effects such as short channel effect and hot carrier effect is observed. Thus, such a device must be operated with a reduced supply voltage.

Due to this situation, studies of devices with novel structure are being promoted. For example, a structure and manufacturing method relating to GOLD (gate-drain overlapped lightly doped drain) technology has been found to allow for an increased supply voltage to be fed to the MOS transistor (Izawa et al., International Electron Device Meeting Technical Digest of Papers, pp. 38-41, 1987, which is hereby incorporated by reference for its teaching on GOLD technology). To help understand the background of the conventional MOS technology, the manufacturing method relating to GOLD Technology is explained below. FIG. 9(a) to (d) are process sectional views for explaining the manufacturing method of a MOS transistor which is based upon GOLD.

As shown in FIG. 9(a), a gate oxide film 112, a thin lower layer polysilicon film 120, thick upper layer polysilicon layer 150 and a silicon oxide layer 160 are sequentially formed on a p-type monocrystalline silicon semiconductor layer 100 to compose a multilayer film. On the gate forming area thereof, a resist pattern 170 is formed by ordinary photolithographic process. Between the thin polysilicon 120 and the thick polysilicon 150, a natural residual oxide film with a thickness of 0.5 to 1 nanometer is formed.

As shown in FIG. 9(b), after forming an oxide film pattern 160A by masking the resist pattern, and by further using this oxide pattern 160A as a mask, the thick upper layer polysilicon 150 is etched to the oxide film using a dry etching technique having a high selective ratio. At this time, the natural oxide film on the surface of the thin lower layer polysilicon 120 is used to inhibit further etching, and the polysilicon 150 is etched in an isotropic shape, thereby forming a polysilicon pattern 150A. By, using the oxide film pattern 160A and polysilicon pattern 150A as the mask, phosphorus ions are implanted to form n-type semiconductor regions 200A, 200B which are formed as a source and a drain in the p-type semiconductor layer 100.

As shown in FIG. 9(c), on the side surfaces of oxide film pattern 160A and polysilicon pattern 150A, silicon oxide films 210A, 210B are selectively left over by anisotropic etching. By using oxide films 210A, 210B as a mask, the thin silicon film is etched and a polysilicon pattern 120A is formed substantially as a gate electrode.

Finally, as shown in FIG. 9(d), using the remaining oxide films 210A and 210B as the mask, arsenic ions of high concentration are implanted to form n-type semiconductor regions 220A, 220B as part of the source and part of the drain in the p-type semiconductor layer 100.

Structural features of thus fabricated GOLD components include the following. The n-type semiconductor region 200B at the end part of the drain sufficiently overlaps (by more than 0.2 microns the polysilicon pattern 120A for the gate electrode). By virtue of this overlap, the electric field which is applied to the drain end is smaller as compared with the MOS element formed in an ordinary method (for example, MOS or LDD [lightly doped drain] structure), generation of a hot carrier in the drain end part of GOLD is suppressed, and a device of excellent reliability (life time) is obtained. In addition, the so-called short channel effect, with its threshold voltage (Vt) which declines as the channel length decreases is small as compared with the conventional MOS. Thus, a MOS device which is small in effective channel length is realized. Since the channel length can be shortened, the mutual conductance is large, and a MOS transistor with a powerful driving ability is obtained.

However, in the conventional etching process of gate electrodes shown in FIG. 9(b), the following problems are known:

(1) Since an extremely thin natural oxide film is used to inhibit etching, a special etchant for dry etching with a large etching selective ratio (more than several hundred times) is required to etch the thick upper layer polysilicon 150.

(2) At the present, a polysilicon etchant (as used in isotropic etching) is capable of etching several hundred times faster than the oxide film. This results in pattern thinning in the upper polysilicon 150. As a result, the wiring resistance of the upper polysilicon wiring increases. As the wiring resistance increases, high speed signal input response to the gate decreases.

(3) As pattern thinning of the upper polysilicon 150 occurs, the oxide film pattern 160A becomes overhung, and coverage of oxide films 210A and 210B left over on the side surface of polysilicon pattern 150A decreases. Since this oxide film is used at the etching mask of the lower polysilicon as the gate electrode, it often leads to fluctuations of gate wiring width (gate length).

(4) When a thick oxide film of over 3 nanometers is used instead of the thin natural oxide film of about 1 nanometer, the electrical connection between the upper layer polysilicon 150 and the lower layer polysilicon 120 becomes poor.

(5) The gate length of the polysilicon gate electrode 120A shown in FIG. 9(c), (d) is greater than the length of the silicon oxide film 160A which is usually processed in the minimum dimension) by the thickness of the left-over silicon oxide films 210A, 210B (called side walls). Hence the gate length of the polysilicon gate electrode 120A is greater than the gate length of a conventional MOS, thus resulting in poor integration.

It is, hence, a primary object of the invention to present a novel gate-drain overlap structure and its manufacturing method in order to solve the forming problems of the gate electrodes of such gate-drain overlap MOS structures of the prior art.

SUMMARY OF THE INVENTION

To achieve the above object of the invention, as well as other objects and features thereof, the invention presents a field effect semiconductor device. A first insulation film for a gate is formed on a semiconductor layer of a first conductive type. A first conductive film to be a gate electrode is formed on the insulation film for the gate. An insulation film is formed of sufficient width so as to not project from above the first conductive film. A second conductive film is formed on the insulation film. A first semiconductor region of a second conductive type as a source and a second semiconductor region of the second conductive type as a drain are disposed in the semiconductor layer of the first conductive type immediately beneath the edge part of the first conductive film as a gate electrode by an ion implantation method using the second conductive film as mask. A third conductive film is selectively left over on the side surface of the second conductive film and the side surface of the insulation film. A third semiconductor region of the second conductive type as part of the source and a fourth semiconductor region of the second conductive type as part of the drain are disposed at the source side and drain side in the semiconductor layer of the first conductive type, so that the region between the second conductor region of the second conductive type as a drain, and the first semiconductor region of the second conductive type as a source is used as a channel part. The upper surface of the first conductive film and the side surface of the second conductive film are electrically connected by way of the third conductive film. These surfaces are arranged so that the width of the first conductive film may nearly coincide with the sum of the width of the second conductive film and the width of the third conductive films left over at both sides of the second conductive film.

The invention also presents a manufacturing method for field effect semiconductor devices as follows. A first insulation film for a gate is formed on a semiconductor layer of a first conductive type. In addition, a first conductive film as a gate electrode is formed on the insulation film for a gate. After forming an insulation film in the first conductive film, and forming a second conductive film on the insulation film, the second conductive film is etched by using the insulation film as the etching inhibitor. A first semiconductor region of a second conductive type is then formed as a source and a second semiconductor region of the second conductive type is then formed as drain. This is done by penetrating impurities of the second conductive type, by the ion implantation method, using the second conductive film as a mask. These impurities are implanted immediately beneath the edge part of the planned gate electrode forming area of the source side and drain side in the semiconductor layer of the first conductive type. The upper surface of the first conductive film and the side surface of the second conductive film are then connected through a third conductive film, leaving the third conductive film on the side surface of the second conductive film and the side surface of the etched insulation film. The first conductive film is then formed into a wiring shape by using the remaining third conductive film and the second conductive film as etching masks. A third semiconductor region of the second conductive type is then formed as a part of the source and a fourth semiconductor region of the second conductive type is then formed as a part of the drain by implanting impurities of the second conductive type into the source side and drain side in the semiconductor layer of the first conductive type. Implantation is done by the ion implantation method using the remaining third conductive layer and the second conductive film as a mask. In doing this the space region between the second semiconductor region of the second conductive type as the drain and the first semiconductor region of the second conductive type as the source is used as the channel area. In addition, the upper surface of the first conductive film and the side surface of the second conductive film are electrically connected through the remaining third conductive film.

DETAILED DESCRIPTION OF THE INVENTION

Embodiment 1

Figure 1:
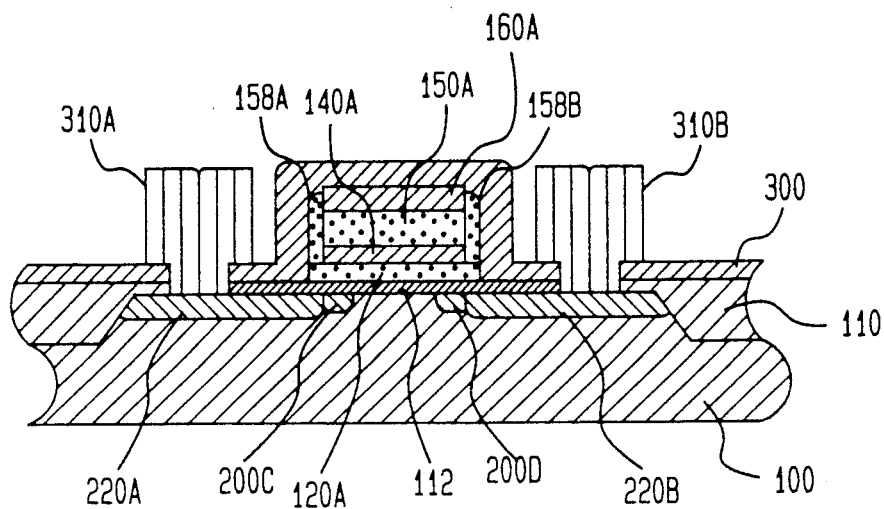
FIG. 1 is a structural sectional view of a MOS transistor as a first embodiment of the invention.

FIG. 1 is a sectional view illustrating the structure of an n-channel MOS transistor as a first embodiment of the invention.

This is a field effect semiconductor device, an MOS transistor. It is formed on a p-type monocrystalline silicon semiconductor or layer 100 (or substrate). A silicon oxide film 110 of about 500 nanometers is used for element separation. A silicon oxide film 112 is used as a first insulation film for a gate. A polysilicon film 120A, a first conductor, used as a gate electrode is formed on the silicon oxide film 112. A silicon oxide film 110A of 100 to 150 nanometers used as an insulator (a buffer film) is formed in a width not projecting from above the polysilicon film 120A. A polysilicon film 150A used as second conductor is formed on the insulator. A first semiconductor region 200C of n-type material as a source and a second semiconductor region 200D of n-type material as a drain is formed by penetrating impurity (phosphorus) of n-type material through the polysilicon film 120A as a first conductive film. Thus, the impurity is implanted immediately beneath the edge part of the planned gate electrode at the source side and drain side in the p-type semiconductor layer. These steps define the disposition of source and drain by the ion implantation method using the polysilicon film 150A and silicon oxide film 160A as the masks. Polysilicon films 158A, 158B as third conductive films selectively remain on the side surface of the second conductive film 150A and the side surface of the insulation film 140A. A third semiconductor region 220A of n+type material as a part of the source, and a fourth semiconductor region 220B of n-type material as part of the drain are formed by implanting the n-type impurity into the source side and drain side of the p-type semiconductor layer. Implantation by ion implantation method is accomplished by using the remaining third conductive films 158A, 158B, the second conductive film 150A and silicon oxide film 160A as the masks. A silicon oxide film 300 is used for surface protection. An aluminum metal electrode 310A is used for a source, and a metal electrode 310B is used for a drain.

The structure of the MOS device in FIG. 1 is characterized as follows. The space region between the n-type second semiconductor region 200D as the drain and the n-type first semiconductor region 200C as the source is used as the channel part. The third conductive films 158A, 158B left over on the upper surface of the first conductive film 120A electrically connect the side surface of the second conductive film 150A and the upper surface of the first conductive film 120A. The width of the first conductive film 120A is defined to nearly coincide with the sum of the width of the second conductive film 150A, and the width of the remaining third conductive films 158A and 158B (in this case, corresponding to the thickness of the deposited conductive film 158). The n-type semiconductor region 200D at the edge of the drain overlaps the polysilicon pattern 120A for the gate electrode (for example, by more than 0.2 micron). Due to this overlap, the electric field applied on the drain end is smaller than in the MOS element formed by an ordinary method. Thus, the generation of a hot carriers in the drain edge part is suppressed, so that a device of excellent reliability (life time) is obtained.

Embodiment 2

Figure 2:
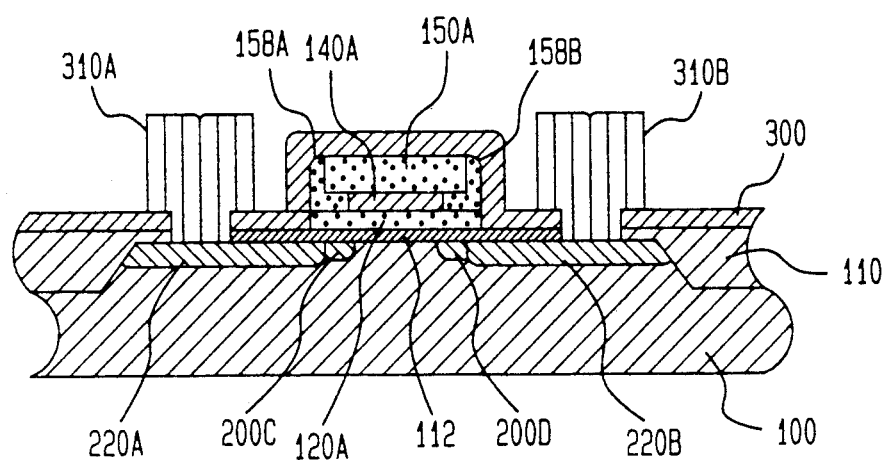
FIG. 2 is a structural sectional view of a MOS transistor as a second embodiment of the invention.

FIG. 2 is a sectional view which explains the structure of a n-channel MOS transistor as a second embodiment of the invention.

This is a field effect semiconductor device composed of MOS transistor. It is formed on a p-type monocrystalline silicon semiconductor layer 100 (or substrate). A silicon oxide film 110 of about 500 nanometers is used for element separation. A silicon oxide film 112 is used as a first insulation film for a gate. A polysilicon film 120A is used as a first conductive film and is a gate electrode which is formed on the silicon oxide film 112. A silicon oxide film 140A of 100 to 150 nanometers as an insulation film is formed in a width not projecting out from above the polysilicon film 120A. A polysilicon film 150A as a second conductive film is formed on the insulation film 140A. A first semiconductor region 200C of a slightly narrow width of n-type material is used as a source and a second semiconductor region 200D of a slightly broad width of n-type material is used as a drain. The source and drain are formed by penetrating the impurity (phosphorus) of n-type through the polysilicon film 120A. The impurities are implanted immediately beneath the edge of the planned gate electrode forming areas at the source side and drain side in the p-type semiconductor layer in order to define the arrangement of the source and drain by the ion implantation method using the polysilicon film 150A as mask.

Polysilicon films 158A, 158B are used as the third conductive films. They are selectively left over on the side surface of the second conductive film 150A and the side surface of the insulation film 140A. A third semiconductive region 220A of n+ type material is used as a part of the source formed by implanting the n-type impurity into the source side and drain side in the n-type semiconductor layer by the ion implantation method in a oblique (tilt angle) direction. This may include, for example, an implantation angle of 10 degree or more from the reference plane vertical to the principal plane of the monocrystalline semiconductor substrate. The remaining third conductive films 158A, 158B and the second conductive film 150A are used as masks. A fourth semiconductor region 220B of n+type as a part of the drain is similarly formed by ion implantation in a nearly vertical direction. For example, an implantation angle may be less than 10 degrees from the reference plane vertical to the principal plane of the monocrystalline semiconductor substrate. A silicon oxide film 300 is used for surface protection. An aluminum metal electrode 310A is used for a source electrode, and a metal electrode 310B is used for a drain electrode.

The structure of the MOS device in FIG. 2 is characterized as follows. The space between the n-type second semiconductor region 200D, as the drain, and the n-type first semiconductor region 200C, as the source, is used as the channel part. The upper surface of the first conductive film 120A and the side surface of second conductive film 150A are electrically connected through the remaining third conductive films 158A, 158B. The width of the first conductive film 120A is defined to nearly coincide with the sum of the width of the second conductive film 150A and the width of the remaining third conductive films 158A and 158B. The n-type semiconductor region 200D of the end part of the drain is sufficiently overlapping with the polysilicon pattern 120A for the gate electrode (more than 0.2 micron). Due to this overlap, the electric field applied to the drain edge is smaller as compared with the MOS device formed by the conventional method. Thus, the generation of a hot carriers in the drain end part is suppressed, and a device of excellent reliability (life time) is obtained.

Prominent structural features include the following.

(1) Since the second semiconductor region 200D of the second conductive type as the drain is formed by the ion implantation method in an oblique (tile angle) direction, the gate and drain easily overlap. Accordingly, the thickness of the third conductive film 158A left over for controlling this overlap amount can be reduced. Thus, the gate length (gate width between source and drain) of the polysilicon gate electrode 120A (the first conductive film) and the gate capacity can be reduced, thereby improving the density of integration and the performance of the MOS transistor.

(2) The second semiconductor region 200D of the second conductive type (as the drain) is formed by the ion implantation method in the oblique direction. The first semiconductor region 200C of the second conductive type (as the source) is formed by ion implantation in a nearly vertical direction. Hence the semiconductor region (as the source) is reduced in size along the channel direction, and an excellent MOS transistor with a small source resistance is obtained.

(3) The second conductive film 150A overhangs the insulation film 140A. The upper surface of the first conductive film 120A and the lower surface of the second conductive film 150A are electrically connected through the remaining third conductive films 158A, 158B, so that the conduction between the first conductive film 120A and the second conductive film 150A is securely achieved. The contact area between the third conductive film and the first or second conductive films can be increased, and therefore the electric resistance due to third conductive film may be decreased.

Embodiment 3

Figure 3:
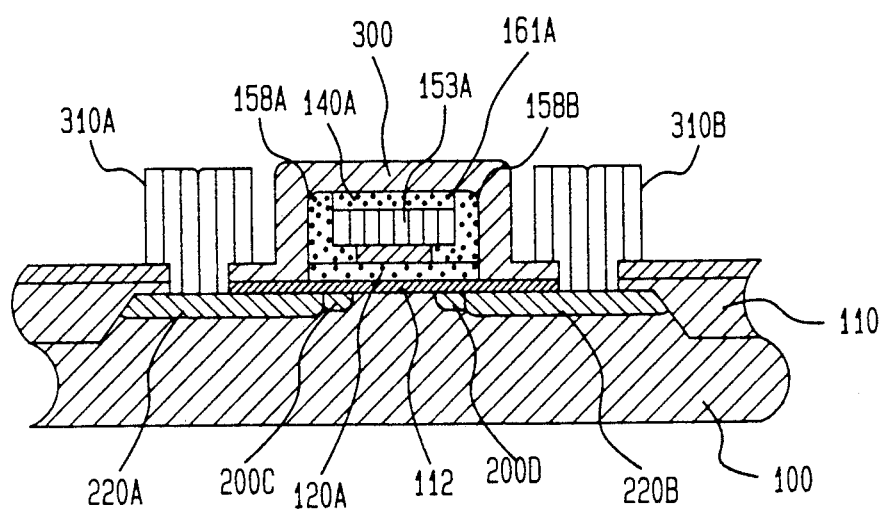
FIG. 3 is a structural sectional view of a MOS transistor as a third embodiment of the invention.

FIG. 3 is a sectional view explaining the structure of n-channel MOS transistor as a third embodiment of the invention.

FIG. 3 shows a field effect semiconductor device composed of MOS transistor disposed on a p-type silicon monocrystalline semiconductor layer 100 (substrate). A silicon oxide film 110 of about 500 nanometers is grown on the substrate 100 for element separation. A silicon oxide film 112 is used as a first insulation film for the gate of the transistor. A polysilicon film 120A is a first conductive film which is the gate electrode of the transistor. This electrode is formed on the silicon oxide film 112. A silicon oxide film 140A of 50 to 150 nanometers acts as an insulation film formed in a width not projecting beyond the polysilicon film 120A. A tungsten silicide conductive film 153A is formed on the insulation film 140A. A polysilicon film 161A acts as a second conductive film of the gate electrode.

A first semiconductor region 200C of n-type material is the source region and a second semiconductor region 200D of n-type material is the drain region of the transistor. These regions are formed by implanting the n-type impurity (phosphorus) through the polysilicon film 120A, thereby implanting the source and drain regions in the p-type semiconductor layer immediately beneath the planned gate electrode. This method defines the disposition of source and drain by the ion implantation using the silicide film 153A as the mask. Polysilicon films 158A, 158B as the third conductive films of the process are selectively left to cover the side surfaces of the metallic conductive film 153A and the side surface of the insulation film 140A. A third semiconductor region 220A of n+ type material is used as a part of the source region and a fourth semiconductor region 220B of n+ type is used as a part of the drain region. These regions are formed by implanting the n-type impurity into the source side and drain side in the p-type semiconductor layer, using the remaining third conductive films 158A, 158B and the second conductive film 150A as masks. A silicon oxide film 300 is formed for surface protection, and aluminum metal electrodes 310A and 310B are formed for the source and for drain connections.

The structure of the MOS device in FIG. 3 is characterized as follows: the space between the second n-type semiconductor region 200D, the drain region, and the first n-type semiconductor region 200C, the source region, is used as a channel. The upper surface of the first conductive film 120A, and the side and lower surfaces of the metallic conductor film 153A are electrically connected through the remaining third conductor films 158A, 158B. The width of the first conductive film 120A is defined to coincide approximately with the sum of the widths of the metallic conductive film 153A and the remaining third conductive films 158A and 158B. In this MOS transistor, the polysilicon pattern 120A for the gate electrode overlaps the n-type semiconductor region 200D of the end part of the drain region (over 0.2 micron). Due to this overlap, the electric field which exists at the edge of the drain region is smaller than in the MOS device formed by the conventional method. Thus, generation of hot carriers in the edge of the drain region is suppressed, so that the device has excellent reliability (life time). Its marked structural features include, among others, the following:

(1) The metallic conductive film 153A is overhanging on the insulation film 140A, and the upper surface of the first conductive film 120A and lower surface of metallic conductive film 153A are electrically connected through the remaining third conductive films 158A, 158B. Therefore conduction between the first conductive film 120A and metallic conductive film 153A is achieved securely, and the contact area between the third conductive film and the first conductive film or metallic conductive film may be increased. This allows the electric resistance due to the third conductive film to be reduced.

(2) Owing to the presence of the insulation film 140A, the first conductive film 120A and the metallic conductive film 153A do not make direct contact with each other. Thus, the stress between films is small, and it is possible to prevent interface state from occurring at the surface of the silicon semiconductor layer or the destruction of the gate oxide film (so-called gate puncture) due to stress. It is, moreover, possible to prevent reactive breakdown of the gate oxide film caused by thermal diffusion atoms of a metal, such as tungsten, from a metal compound, such as tungsten silicide, which is used as the metallic conductive film of an upper layer into the polysilicon film as a first conductive film. In addition, by forming the second conductive film on the tungsten silicide film, which is a metallic conductive film, using the same material (polysilicon) as is used in the first conductive film, the stress of the metallic conductive film enclosed by them may be further lessened, and a preferable effect may be obtained.

Embodiment 4

Figure 4A:
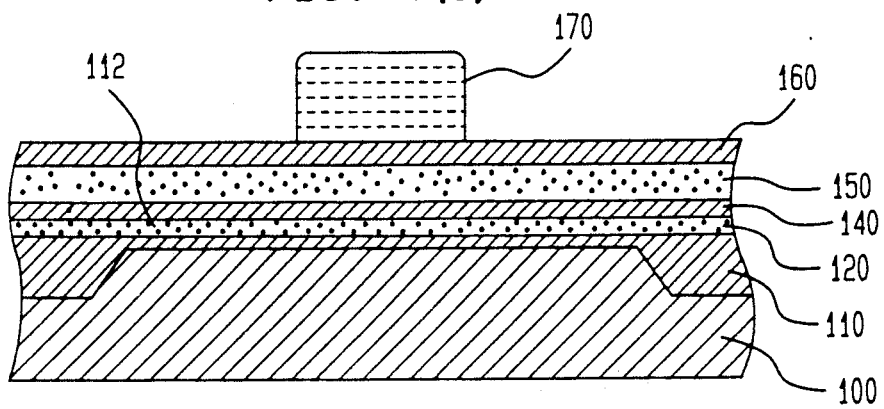
FIGS. 4a-4e are a series of process sectional views showing a method of manufacturing a MOS transistor as a fourth embodiment of the invention.

FIGS. 4(a) and (e) show a series of process sectional views that describe the manufacturing method of principal parts of n-channel MOS transistor as a fourth embodiment of the invention.

As shown in FIG. 4(a), the transistor has a p-type silicon monocrystalline semiconductor layer 100 (substrate) and an oxide film 110 of about 500 nanometers for element separation. An oxide film 112 of about 10 to 30 nanometers is grown on the substrate 100. A polysilicon film 120 of 50 to 150 nanometers is deposited as a first conductive film. A CVD silicon oxide film 140 of 100 to 150 nanometers is formed as an insulation film, and a polysilicon film 150 of 200 to 300 nanometers is deposited as a second conductive film. A silicon oxide film 160 of about 100 nanometers is formed on the film 150. A resist pattern 170 in a width of 0.5 to 0.8 micron is formed on an area to be used as the gate of the transistor.

Figure 4B:
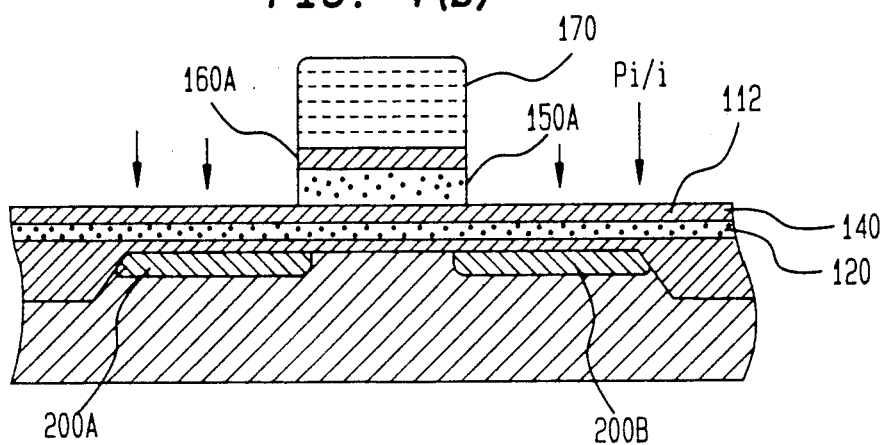

As shown in FIG. 4(b), using the resist pattern 170 as the mask, the silicon oxide film 160 is etched by anisotropic reactive ion etching to form a silicon oxide film pattern 160A. In addition, the polycrystalline polysilicon film 150 is selectively etched by anisotropic etching to form a second conductive film, and a polysilicon film pattern 150A. The insulation film 140 stops the etching. Using this method it is possible to etch efficiently and easily. Here, using a vertical ion implantation method (for example, one having an injection angle of less than 10 degrees from the reference plane), phosphorus ions in a concentration of $5 \times 10^{12}$ to $1 \times 10^{15}$ cm$^{-2}$ are implanted through the gate oxide film 112, polysilicon film 120 and CVD oxide film 140, to define a first n-type semiconductor region 200A as the source and a second n-type semiconductor region 200B as the drain in the p-type semiconductor layer 100.

Figure 4C:
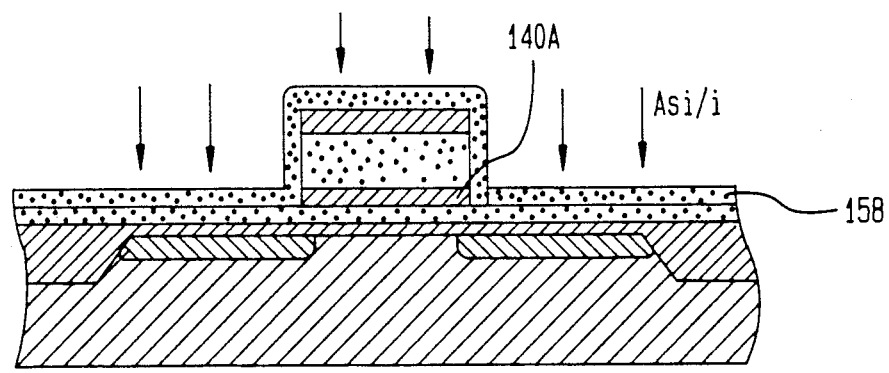

As shown in FIG. 4(c), using a resist pattern 170 (not shown), the silicon oxide film 140, which is an insulation film, is etched to form a silicon oxide film pattern 140A. After removing the resist pattern 170, a polysilicon film 158 of 200 to 300 nanometers is deposited on the whole surface as a third conductive film. Arsenic ions in a concentration of $1 \times 10^{16}$ cm$^{-2}$ are then implanted in the polysilicon film 158. Using a heat treatment at about 900 deg.C., arsenic ions are diffused in the polysilicon film 158, thereby lowering its resistance.

Figure 4D:
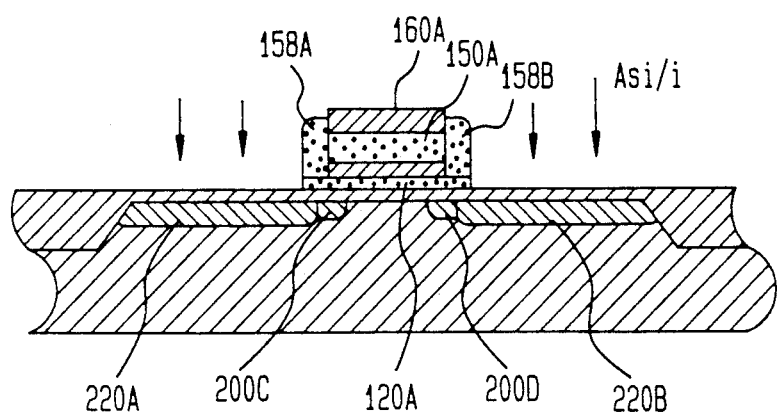

As shown in FIG. 4(d), the entire surface of the polysilicon film 158 is etched by anisotropic reactive ion etching, and the polysilicon films 158A, 158B remain on the side surface of patterns 160A, 150A. Furthermore, using the polysilicon films 158A, 158B, and polysilicon film 150A as the masks, the polysilicon film 120 is etched to form the polysilicon pattern 120A. This pattern substantially defines the gate electrode. Using nearly vertical ion implantation method, arsenic ions were implanted in a concentration of 2 to $9 \times 10^{15}$ cm$^{-2}$, using the polysilicon films 158A, 158B and polysilicon film 150A as the masks. The device is then subject to heat treatment at about 900 deg.C., thereby forming a third and fourth semiconductor region 220A and 220B of n+ type material as a part of the source and as a part of the drain respectively in the p-type semiconductor layer 100. In the edge part of the drain, the n-type semiconductor region 200D which is substantially the drain, and the n-type semiconductor region 200C which is the source are left over at the same time.

Figure 4E:
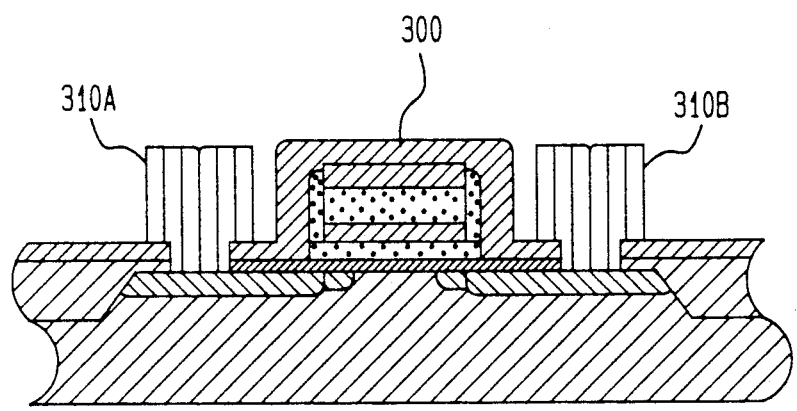

As shown in FIG. 4(e), after depositing a silicon oxide film 300 for insulation on the entire surface, openings for contacts such as for source and drain contacts are formed by the conventional manufacturing method. Aluminum metal electrodes 310A and 310B are formed to connect to the source and drain, respectively.

The MOS transistor fabricated by the process of this invention has the n-type semiconductor region 200D at the end of the drain region overlap (for example, by more than 0.2 micron) on the polysilicon pattern 120A which defines the gate electrode. This overlap is sufficient so that the electric field applied to the drain edge part is small as compared with the MOS element formed by the ordinary method. Thus, the generation of hot carriers at the drain edge part is suppressed. This device has excellent reliability (life time). The major features of the manufacturing method include the following.

(1) Since the thickness of the insulation film 140 can be relatively large, etching of the second conductive film 150 of the upper layer is simplified.

(2) Electric connection of the second conductive film 150 of the upper layer and the first conductive film 120 of the lower layer is easily achieved using the third conductive films 158A, 158B.

(3) Since the thickness of the insulation film 140 may be relatively large, the etching of the second conductive film 150 of the upper layer is simplified. This is so even when anisotropic dry etching of poor etching selection ratio are used. Therefore, the shape of coverage is excellent, and a gate electrode of small wiring electric resistance is obtained without thinning of the pattern.

In this embodiment, various manufacturing extensions and variations may be considered. For example, the p-type well region of C-MOS may be used as the p-type semiconductor layer 100, instead of the p-type silicon substrate. In this embodiment, incidentally, ion implantation into the p-type semiconductor layer 100 for controlling the inverting (threshold) voltage of the MOS gate is omitted, but may be employed if necessary. The silicon oxide film 160A disadvantageously increases the step difference of the gate part, and may be omitted. Since when phosphorus ions are implanted they may penetrate through the polysilicon film pattern 150A by the so-called channeling phenomenon, it is preferable to form the silicon oxide film pattern 160A. When forming the first and second semiconductor regions 200A, 200B as source and drain by ion implantation, ions are implanted over the insulation film 140. Depending on the case, after etching the insulation film 140, ions may be implanted over the first conductive film 120 to form the first and second semiconductor regions.

It is a structural feature of the invention that the width of the first conductive film is arranged to nearly coincide with the sum of the width of the second conductive film and the width of the third conductive films disposed at both sides of this second conductive film. The manufacturing factor for defining the width of the third conductive films is as follows. As a method of forming the third conductive films, aside from the single layer film of polysilicon film or the like, a two-layer film depositing technique may be used. By this technique a silicon oxide film is deposited on the polysilicon film. As a method of leaving a part of the third polysilicon film on both sides of the second conductive film, first, using anisotropic etching, the silicon oxide film remains in a form (so-called side wall) at both sides of the second conductive film. This side wall shaped silicon oxide film is used as the etching mask to etch the polysilicon film of the base. In this case, the shape of the polysilicon film remaining after the etching (a part of the third conductive film) is an L-figure. The portion defining the width of the third conductive film is on the side surface of the second conductive film, and coincides with the portion of the third conductive film that contacts with the first conductive film. This method of etching the base polysilicon film using the side wall shaped silicon oxide film as the etching mask is preferable because overetching of the polysilicon film can be prevented by the presence of the side wall shaped silicon oxide film remaining as a result of leaving the polysilicon as the third conductive film.

Embodiment 5

FIGS. 5(a) to (d) shows a series of process sectional views for explaining the manufacturing method of essential parts of the n-channel MOS transistor as a fifth embodiment of the invention.

Figure 5A:
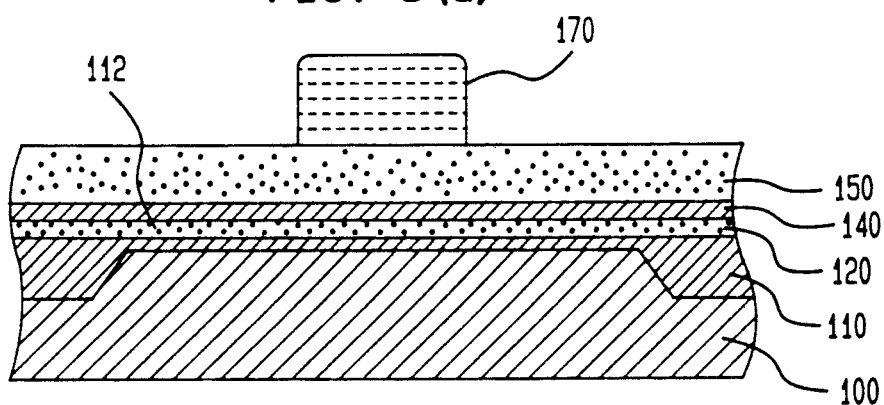
FIGS. 5a-5d are a series of process sectional views showing a method of manufacturing a MOS transistor as a fifth embodiment of the invention.

As shown in FIG. 5(a), the transistor is built on a p-type silicon monocrystalline semiconductor layer 100 (or substrate). An oxide film 110 of about 500 nanometers, for element separation, and a gate oxide film 12 of about 10 to 30 nanometers were grown on the substrate 100. A polysilicon film 120 of 50 to 150 nanometers is deposited as a first conductive film. A CVD silicon oxide film 140, of 50 to 150 nanometers is deposited as an insulation film, and a polysilicon film 50 of 200 to 400 nanometers is deposited as a second conductive film. Phosphorus as phosphorus oxychloride (POCl$_3$) in a high temperature heat treatment stage as impurity doping to the polysilicon film 150. This doping step lowers the resistance of the polysilicon film 150. A resist pattern 170 having a width of 0.5 to 0.8 micron is formed on the area to be used for the gate. As this insulation film, it is also possible to use a silicon oxide film formed by thermally oxidizing the polysilicon film 120 which is the first conductive film.

Figure 5B:
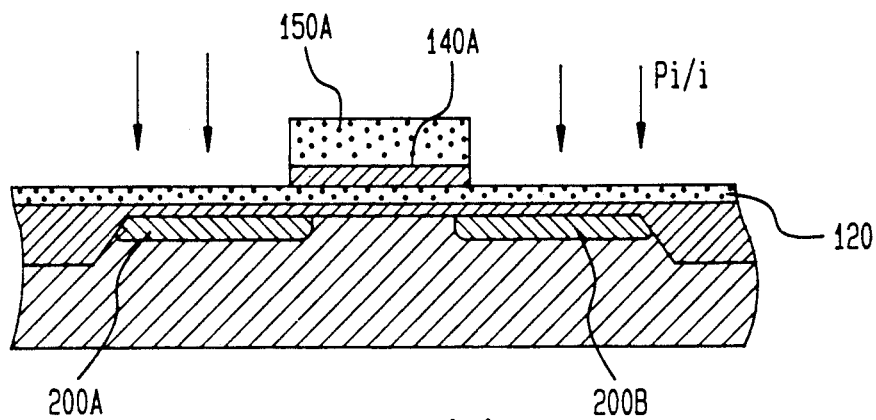

As shown in FIG. 5(b), using the resist pattern 170 (not shown) as the mask, the nonmonocrystalline polysilicon film 150 is selectively etched by anisotropic etching, to form the polysilicon film pattern 150A. The CVD silicon oxide film 140 is used to stop the etching. Thus, it is possible to etch efficiently and easily.

After removing the resist pattern 170, the polysilicon film pattern 150A is used as the etching mask to etch the silicon oxide film 140, to form a silicon oxide film pattern 140A. This etching step also exposes the surface of the polysilicon film 120. Using the polysilicon film pattern 150A as the implantation mask, and using a nearly vertical ion implantation method (for example, an implantation angle of less than 10 degrees from the reference plane vertical to the principal plane of the monocrystalline semiconductor substrate), phosphorus ions in a concentration of $5 \times 10^{12}$ to $1 \times 10^{15}$ cm$^{-2}$ are implanted through the gate oxide film 112 and polysilicon film 120, thereby forming first and second n-type semiconductor region 200A and 200B as the source and drain, respectively, in the p-type semiconductor layer 100.

Figure 5C:
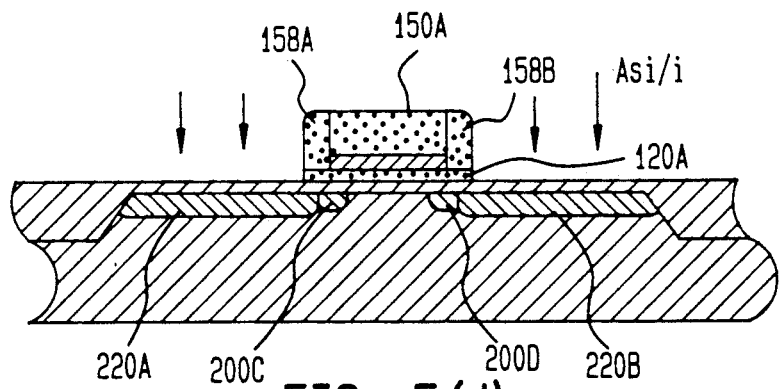

As shown in FIG. 5(c), a polysilicon film 158 (not shown) of 50 to 300 nanometers is deposited on the entire surface as a third conductive film, and the polysilicon film 158 is etched by anisotropic reactive ion etching, to leave polysilicon films 158A, 158B at the side surfaces of the polysilicon pattern 150A. Using the polysilicon films 158A, 158B and the polysilicon film 150A as the mask, the polysilicon film 120 is etched to form a polysilicon pattern 120A which substantially defines the gate electrode. Using a nearly vertical ion implantation method, in which the polysilicon films 158A, 158B and polysilicon film 150A act as the masks, arsenic ions in a concentration of 2 to 9 $10^{15}$ cm$^{-2}$ are implanted. Using a heat treatment at about 900 deg.C., third and fourth n+ type semiconductor regions 220A and 220B are formed as a part of the respective source and drain in the p-type semiconductor layer 100. These process steps leave n-type semiconductor regions 200D and 200C at the ends of the drain and source, respectively.

Figure 5D:
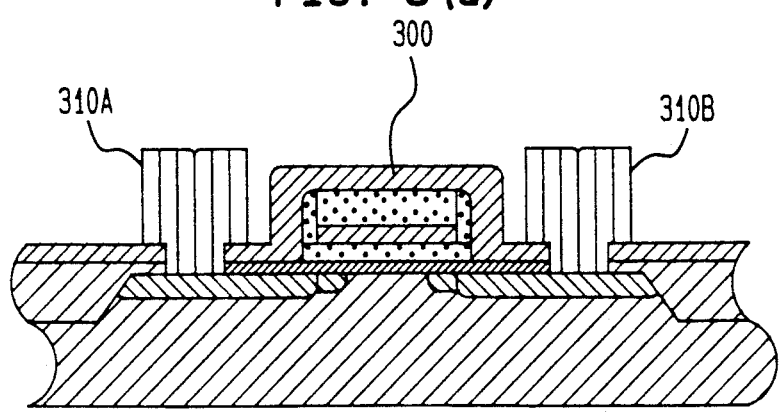

As shown in FIG. 5(d), after depositing a silicon oxide film 300 for insulation on the entire surface, openings for contacts such as source and drain connections are formed according to a conventional manufacturing method. Into these openings aluminum metal electrodes 310A and 310B are formed to connect to the source and drain, respectively.

The MOS transistor fabricated using this inventive process has the n-type semiconductor region 200D of the drain edge part overlapping (by more than 0.2 micron) on the polysilicon pattern 120A for gate electrode. Because of this overlap, the electric field applied to the drain end is smaller than that which could exist with an MOS device formed by the conventional method. Thus, the generation of hot carriers is suppressed in the drain end part, thereby providing a device of excellent reliability (lifetime). As a feature of the manufacturing method, in this embodiment, the silicon oxide film pattern 160A, described in the above reference to the third embodiment, is not formed. The process is simplified by omitting this step. In addition, without this step, the step difference due to the film thickness in the gate electrode portion is reduced. The polysilicon films 158A, 158B as the third conductive film remain in the side surfaces of the polysilicon pattern 150A. The resistance of the third conductive film 158 is reduced by simply diffusing the impurity phosphorus, contained in the second conductive film, into the third conductive film using a heat treatment step.

Embodiment 6

FIGS. 6(a) to (d) show a series of sectional views which are useful for explaining the manufacturing method of principal parts of an n-channel MOS transistor as a sixth embodiment of the invention.

Figure 6A:
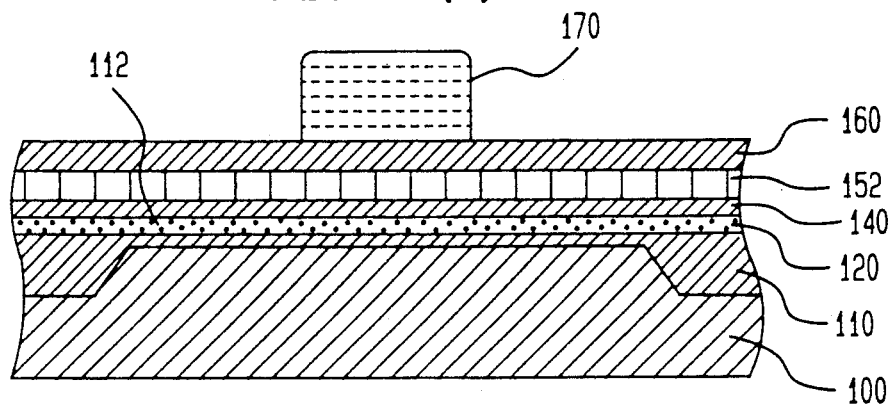
FIGS. 6a-6d are a series of process sectional views showing a method of manufacturing a MOS transistor as a sixth embodiment of the invention.

As shown in FIG. 6(a), the transistor is formed on a p-type silicon monocrystalline semiconductor layer 100 (substrate). An oxide film 110 of about 500 nanometers, for element separation, and a gate oxide film 112 of about 10 to 30 nanometers are grown on the substrate 100. A polysilicon film 120, of 50 to 150 nanometers is deposited as a first conductive film, a CVD silicon oxide film 140 of 100 to 150 nanometers is deposited as an insulation film, a tungsten silicide (WSi$_2$) film 152 of 200 to 300 nanometers is deposited as a second conductive film. A silicon oxide film 160 of about 200 nanometers is formed on top of the film 152. A resist pattern 170 of 0.5 to 0.8 micron in width, is formed on the area to be used for the gate.

Figure 6B:
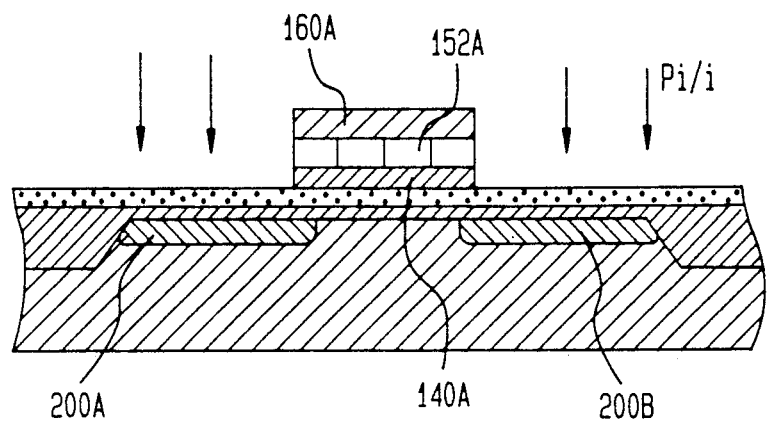

As shown in FIG. 6(b), using the resist pattern 170 (not shown) as a mask, the silicon oxide film 160 is etched using anisotropic reactive ion etching, to form a silicon oxide film pattern 160A. The polycrystalline tungsten silicide film 152 is selectively etched by anisotropic etching, thereby forming a pattern 152A. The insulation film 140 is used to inhibit etching. This makes it possible to etch efficiently and easily. Here, after removing the resist pattern 170, a nearly vertical ion implantation method (for example, an implantation angle of less than 10 degrees to the reference plane), is used to implant phosphorus ions in a concentration of $5 \times 10^{12}$ to $1 \times 10^{15}$ cm$^{-2}$ through the gate oxide film 112 and polysilicon film 120. This forms first and second n-type semiconductor regions 200A and 200B, the source and drain, respectively, in the p-type semiconductor layer 100.

Figure 6C:
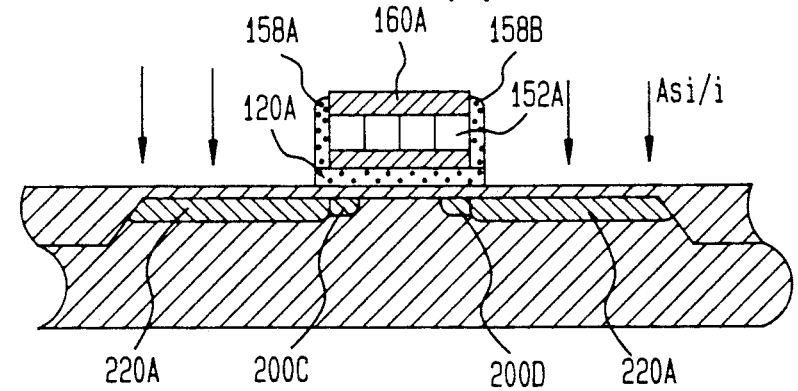

As shown in FIG. 6(c), after depositing a polysilicon film 158 (not shown) in 50 to 200 nanometers, polysilicon films 15A, 15B remain on the side surfaces of patterns 160A, 152A by removing the film 158 using reactive ion etching. Using the polysilicon films 158A, 158B and tungsten silicide film 152A as the masks, the polysilicon film 120 is etched to form a polysilicon pattern 120A as a gate electrode. Using nearly vertical ion implantation, in which the polysilicon films 158A, 158B and tungsten silicide film 152A act as the masks, arsenic ions are implanted in a concentration of 2 to $9 \times 10^{15}$ cm$^{-2}$. Using proper heat treatment, third and fourth n+ type semiconductor regions 220A and 220B are formed as a part of the source and drain, respectively, in the p-type semiconductor layer 100. After these process steps, n-type semiconductor regions 200D and 200C are left over as the drain and source, respectively.

Figure 6D:
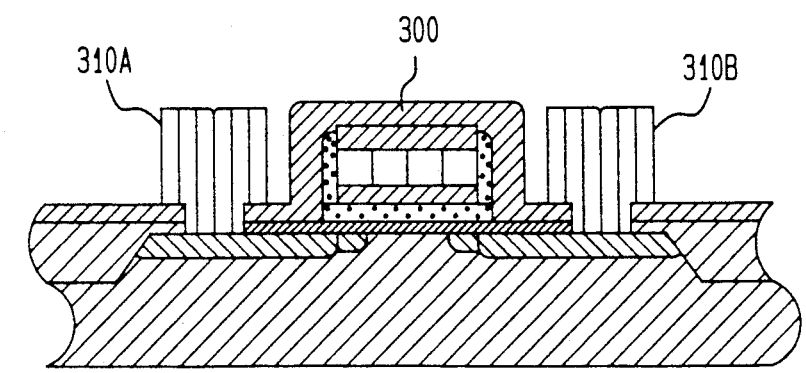

As shown in FIG. 6(d), after depositing a silicon oxide film 300 for insulation on the entire surface, contact openings such as for the source and drain are formed by the conventional manufacturing method. Aluminum metal electrodes 310A and 310B are formed to connect to the source and drain, respectively.

The MOS transistor fabricated by this inventive process has n-type semiconductor regions 200C and 200D in the ends of the respective source and drain regions, which overlap on the polysilicon pattern 120A that defines the gate electrode. Due to this overlap, the electric field applied to the drain end is smaller than that which would be obtained for a MOS device formed by the conventional method. Thus, hot carriers in the drain end are suppressed, so that a device of excellent reliability (lifetime) is obtained. As a feature of the manufacturing method of the invention, in this embodiment, metal compounds such as tungsten silicide and metal silicide can be used in place of the nonmonocrystalline semiconductor film such as polysilicon and amorphous silicon for the second conductive film 152. This technique reduces the wiring resistance of the gate. Furthermore, the thickness of the insulation film 140 may be relatively large, thus making it possible to suppress the stress generated particularly due to differences in the coefficient of thermal expansion between the metal silicate 152, or other metal silicides, used as the second conductive film, and the polysilicon 120 of the first conductive film. Furthermore, due to the presence of the insulation film 140, the first conductive film 120 and second conductive film 152 do not directly contact each other. Thus, stress-derived gate failure may be prevented. This structure also reduces or prevents the reactive breakdown (gat puncture) of the gate oxide film 112 caused by thermal diffusion of tungsten metal atoms from the metal compound 152 into the polysilicon film 120 of the first conductive film. Aside from tungsten silicide film, metal compounds such as tungsten, molybdenum, molybdenum silicide and other metal silicides may be used. In particular, the inventors found that when a titanium compound, which is preferable for lowering the resistance of the gate, is used as the second conductive film 152, the gate oxide film 112 was easily broken down. In this instance it is more effective to use an intervening insulation film as disclosed in this invention.

Embodiment 7

FIGS. 7(a) to (f) show a series of process sectional views which are useful for explaining the manufacturing method of essential parts of the n-channel MOS transistor as a seventh embodiment of the invention.

Figure 7A:
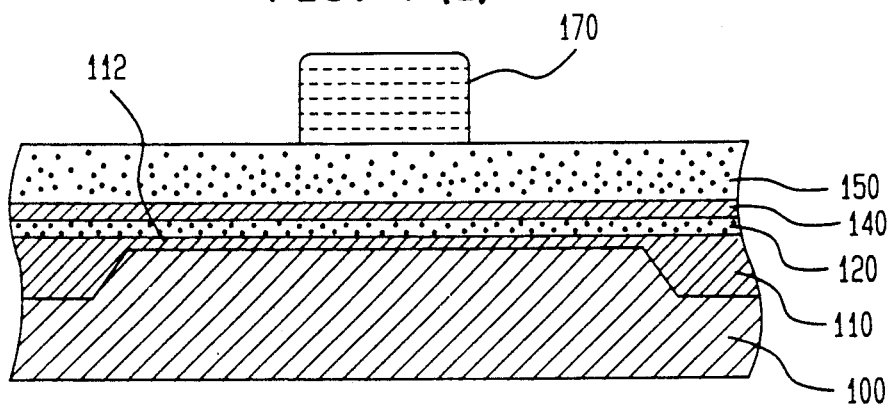
FIGS. 7a-7f are a series of process sectional views showing a method of manufacturing a MOS transistor as a seventh embodiment of the invention.
Figure 7B:
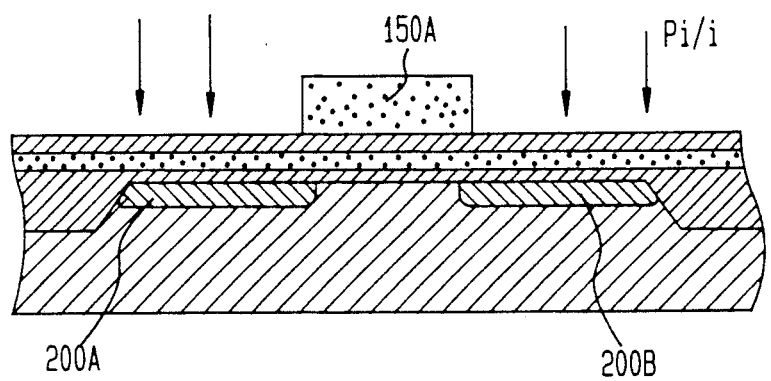

As shown in FIG. 7(a), the transistor is built on a p-type silicon monocrystalline semiconductor layer 100 (substrate). An oxide film 110 of about 500 nanometers for element separation and a gate oxide film 112 of about 10 to 30 nanometers are grown on the substrate 100. An amorphous silicon film 120 of 50 to 150 nanometers is deposited as a first conductive film. A CVD silicon oxide film 140, made at low temperature (for example, 500 deg.C. or less) in 50 to 150 nanometers is formed as an insulation film. A polysilicon film 150 of 200 to 400 nanometers is deposited as a second conductive film. Arsenic ions are implanted as impurity doping into the amorphous silicon film 150, and a resist pattern 170 in a width of 0.5 to 0.8 micron is formed on the area to be used as the planned gate.

As shown 7(b), using the resist pattern 170 (not shown) as a mask, the polycrystalline amorphous silicon film 150 is selectively etched by anisotropic etching to form a silicon film pattern 150A. By using the CVD silicon film 140 as the etching inhibitor, etching is conducted efficiently and easily. After removing the resist pattern 170, phosphorus ions in a concentration of between $5 \times 10^{12}$ and $1 \times 10^{15}$ cm$^{-2}$ are implanted through the gate oxide film 112, amorphous silicon 120 and CVD oxide film 140 using nearly vertical ion implantation method (for example, an implantation angle of less than 10 degrees to the reference plane)using the silicon film pattern 150A as the mask for implantation. First and second n-type semiconductor regions 200A and 200B as the source and drain, respectively, are formed in the p-type semiconductor layer 100.

Figure 7C:
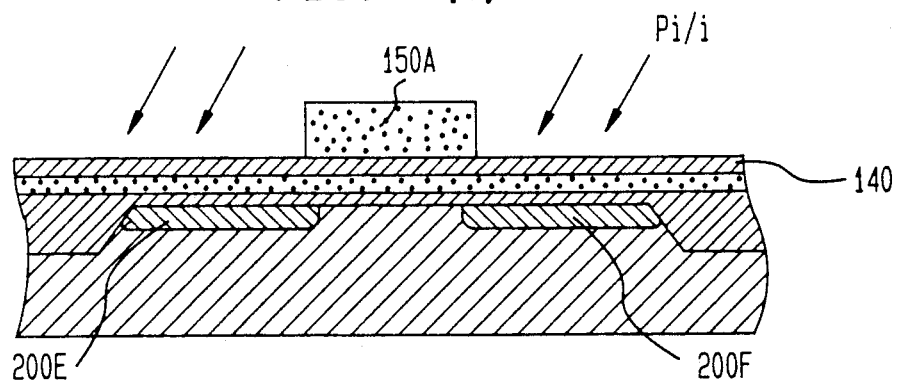

As shown in FIG. 7(c), using the silicon film pattern 150A as the mask for implantation, phosphorus ions in a concentration of between $5 \times 10^{12}$ and $1 \times 10^{15}$ cm$^{-2}$ are implanted through the gate oxide film 112, polysilicon film 120 and CVD oxide film 140. The ion implantation method uses an oblique implantation angle (for example, 10 degrees or more from the plane vertical to the reference plane) from the drain side. A first semiconductor region 300E of n-type material as the source is formed in the p-type semiconductor layer 100, while a second semiconductor region 200F of n-type material as the drain is formed in the planned gate electrode edge area so as to overlap sufficiently. When implanting phosphorus ions, an amorphous silicon film is used as the silicon film 20 for passing ions. However, when the silicon film 120 is used as polysilicon form, the impurity profile is likely to be disturbed due to the so-called channeling effect. Therefore, the use of amorphous silicon is desired to prevent this channeling.

Figure 7D:
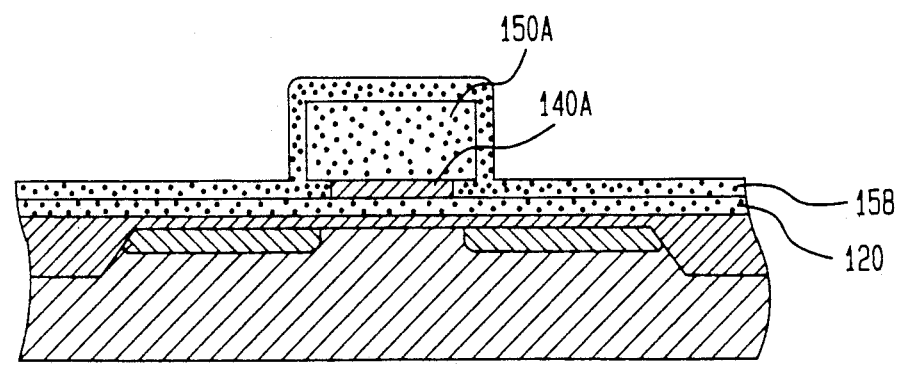

As shown in FIG. 7(d), the silicon oxide film 140 is anisotropically etched by ammonium fluoride. This forms a silicon oxide film pattern 140A which overhangs the silicon film 150A. An amorphous silicon film 158 of 70 to 200 nanometers is then deposited on the entire surface as the third conductive film. The impurity in the n-type semiconductor region 200 formed by implantation is then heat treated at a high temperature (approximately 900° C.). This activates the impurity. The amorphous silicon films 50A, 158 are then transformed into polysilicon.

Figure 7E:
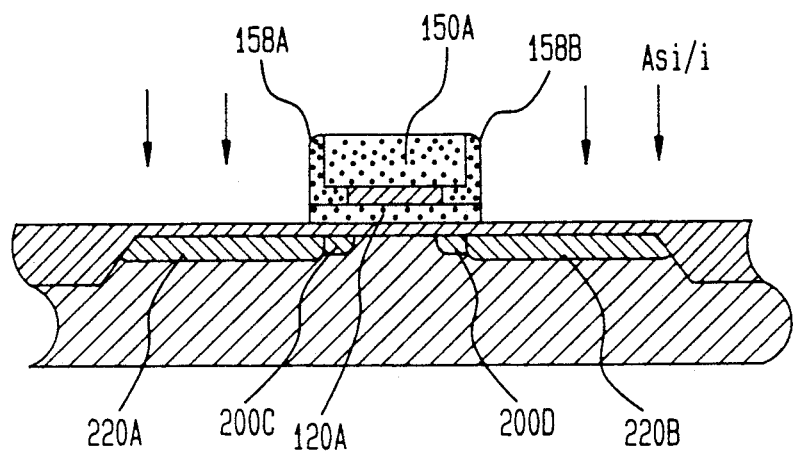

As shown in FIG. 7(e), the polysilicon film 158 is entirely etched by anisotropic reactive ion etching. Polysilicon films 158A, 158B remain on the side surfaces of the polysilicon pattern 150A. Using the polysilicon films 158A, 158B and polysilicon film 150A as masks, the polysilicon film 120 is etched to form a polysilicon film 120A to be substantially a gate electrode. In addition, using the nearly vertical ion implantation method, arsenic ions of 2 to $9 \times 10^{15}$ cm$^{-2}$ are implanted by using the polysilicon films 158A, 158B and polysilicon film 150A as masks. By using the heat treatment at about 900 deg.C., a third semiconductor region 220A of n+ type material as a part of the source and a fourth semiconductor region 220B of n+ type material as a part of the drain are formed in the p-type semiconductor layer 100. At this time, a semiconductor region 200D of n-type material (to be used as a drain) is left over in the end part of the drain, while a semiconductor region 200C of n-type material (to be used as a source) is left over at the same time.

Figure 7F:
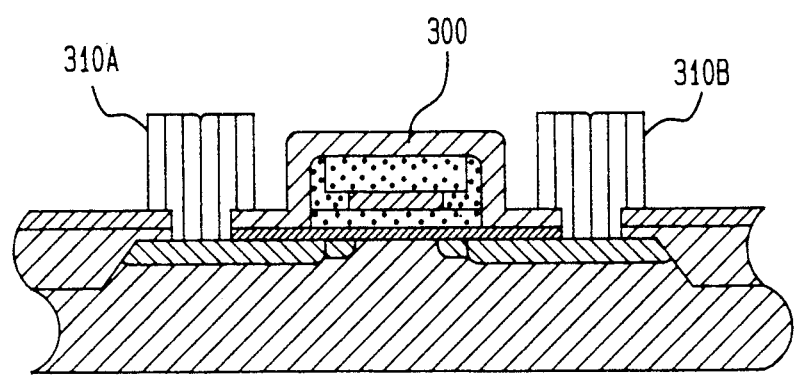

As shown in FIG. 7(f), after depositing a silicon oxide film 300 for insulation on the entire surface, contact openings of source, drain and others are formed by the conventional manufacturing method. An aluminum metal electrode 310A (to be used as the source) and an aluminum metal electrode 310B (to be used as the drain) are formed.

The MOS transistor fabricated by this process has the n-type semiconductor region 200D of the drain edge part overlapping the polysilicon pattern 120A which defines the gate electrode. This overlap is sufficient so that the electric field applied to the drain edge part, compared with the MOS device formed by the conventional method, may be reduced. The generation of a hot carrier in the drain end part is thus suppressed, thereby obtaining a device of an excellent reliability (lifetime). Features of the manufacturing method may include the following.

(1) Since the second semiconductor region 200F of the second conductive type as the drain is formed by oblique direction ion implantation method, the gate and drain overlap easily. Thus, the thickness of the third conductive films 158A, 158B left over for controlling the overlap amount may be decreased, the channel length (the distance between source and drain) determined by the width of the polysilicon gate electrode (the first conductive film of wiring shape) may be reduced, and the electric characteristics of the MOS transistor (i.e. mutual conductance) is improved.

(2) The second semiconductor region 200F of the second conductive type as the drain is formed by the oblique direction ion implantation method. The first semiconductor region 200E of the second conductive type as the source is formed by the ion implantation method at an angle which is nearly close to the vertical direction. Therefore, the first semiconductor region 200E as the source is small, thereby obtaining an excellent MOS transistor with a small source resistance.

(3) By overhang of the second conductive film 150A against the insulation film 140A, the electrical connection between the upper surface of the first conductive film 120A and the lower surface of the second conductive film 150A by means of the remaining third conductive films 158A, 158B, it is possible to achieve secure conduction between the first conductive film 150A and the second conductive film 120A. Hence, the contact area between the third conductive film and the first conductive film or the second conductive film may be widened, resulting in a lowered electric resistance by the third conductive film.

Alternative embodiments of the invention include various improvements. For example, a thin titanium nitride may be used as the insulation film 140 and polysilicon films may be used as the first and second conductive films 120, 150, thus reducing the electric resistance of the gate electrode. The diffusion of titanium atoms from the titanium nitride is absorbed in the upper layer polysilicon 150, thus making it possible to suppress the breakdown of the gate 112. Furthermore, in the foregoing embodiments of the invention, the manufacturing method of n-channel MOS was described. By exchanging p and n impurities, it is possible to apply the method of the invention to the p-channel MOS or C-MOS, etc. Moreover, the structure of the gate electrode and its forming method may also be employed in general single-diffusion source-drain type MOS (for example, the MOS without forming n-type semiconductor regions 200C, 200D in FIG. 1, etc.). Furthermore, in FIG. 7(d), by anisotropic etching of the third conductive film 158, the third conductive film 158 may be removed from the side surface of the overhung second conductive film, and the third conductive film may remain on the lower surface of the second conductive film. In this case, the width of the first conductive film as the gate (nearly equal to the width of the second conductive film) becomes narrow, and the gate capacity decreases, thus improving high speed performance.

FIGS. 8(a) to (e) show a series of process sectional views which are useful for explaining the manufacturing method of essential parts of the n-channel MOS as an eighth embodiment of the invention.

Figure 8A:
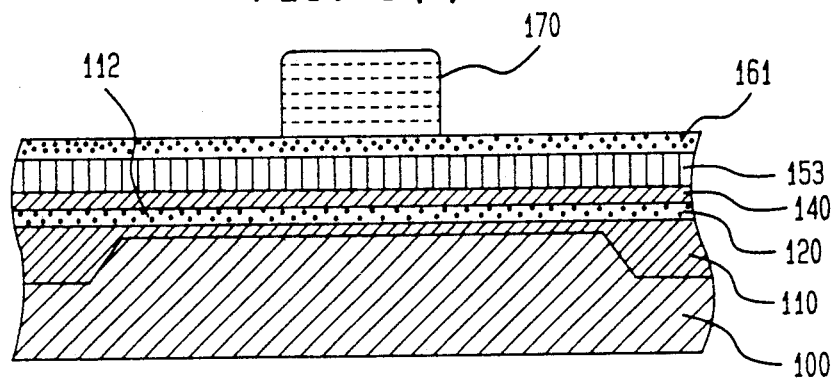
FIGS 8a-8e are a series of process sectional views showing a method of manufacturing a MOS transistor as a eighth embodiment of the invention.
Figure 8B:
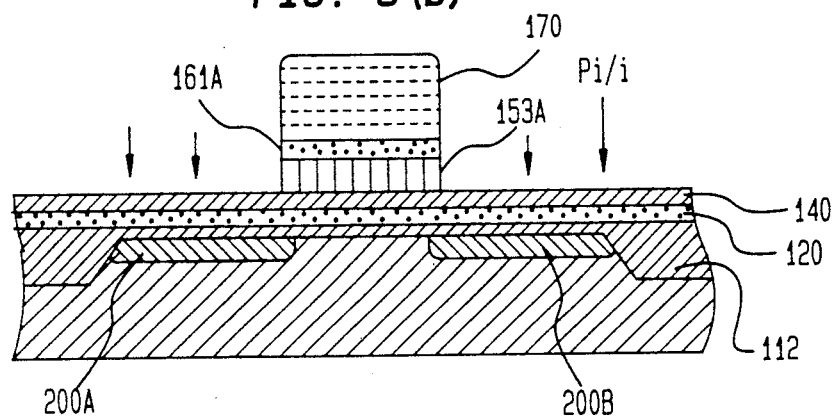

As shown in FIG. 8(a), the transistor is built on a p-type silicon monocrystalline semiconductor layer 100 (or substrate). An oxide film 110 of about 500 nanometers for element separation, and a gate oxide film 112 of about 10 to 30 nanometers are formed on the substrate. A polysilicon film 120 of 50 to 150 nanometers is used as a first conductive film. A CVD silicon oxide film 140 of 50 to 150 nanometers is used as an insulation film. A tungsten silicide ($WSi_2$) film 153 of 100 to 200 nanometers is used as a metallic conductive film. A polysilicon film 161 of about 100 nanometers is used as a second conductive film. A resist pattern 170 in a width of 0.5 to 0.8 micron is formed on the planned gate forming area. As shown in FIG. 8(b), using the resist pattern 170 as the mask, the polysilicon film 161 is etched by anisotropic reactive ion etching to form a polysilicon film 161A. In addition, by anisotropic etching, a polycrystalline tungsten silicide film 153 (i.e. metallic conductive film) is selectively etched to form a silicide film 153A. The insulation film 140, as the etching inhibitor, is used at this time, which makes it possible to etch efficiently and easily. After removing the resist pattern 170, phosphorus ions of $5 \times 10^{12}$ to $1 \times 10^{15}$ cm$^{-2}$ are implanted through the gate oxide film 112 and polysilicon film 120 by the ordinary ion implantation method. For example, an implantation angle of less than 10 degrees to the reference plane is used. A first semiconductor region 200A of n-type material is used as the source and a second semiconductor region 200B of n-type material is used as the drain. They are formed in the p-type semiconductor layer 100.

Figure 8C:
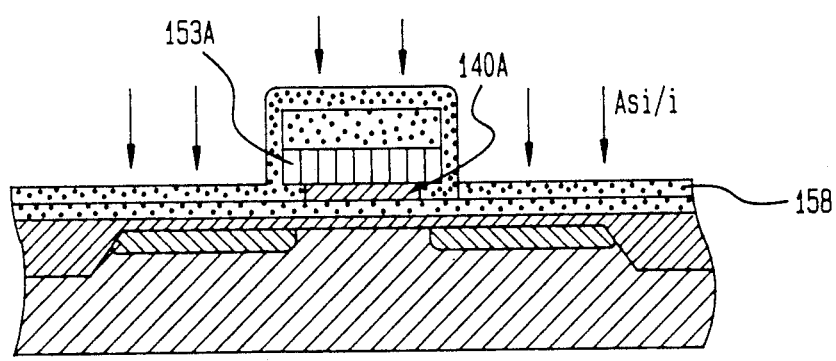

As shown in FIG. 8(c), a polysilicon film 158 of 50 to 300 nanometers is deposited as a third conductive film on the entire surface. Arsenic ions of $1 \times 10^{16}$ cm$^{-2}$ are implanted into the polysilicon film 158. By using heat treatment (at approximately 900° C.), the arsenic ions in the polysilicon film 158 are diffused thus lowering the resistance of the polysilicon film 158.

Figure 8D:
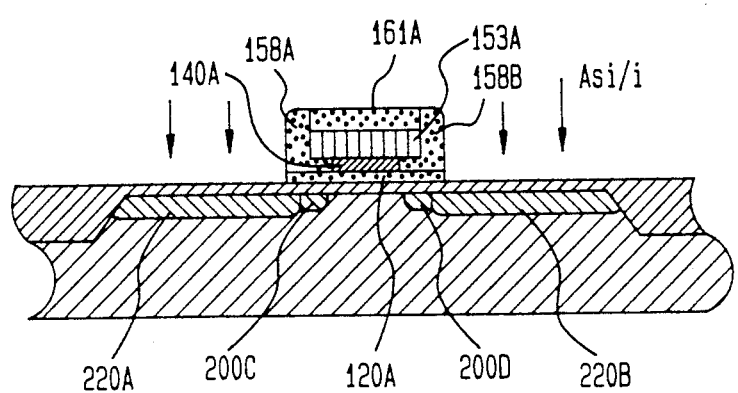

As shown in FIG. 8(d), by entirely etching the polysilicon film 158 through anisotropic reactive ion etching, polysilicon films 158A, 158B are left over on the side surfaces of the patterns 161A, 153A. Furthermore, using the polysilicon films 158A, 158B, polysilicon film 161A and silicide film 153A as masks, polysilicon film 120 is etched to form a polysilicon pattern 120A, thus forming a gate electrode. Arsenic ions of 2 to $9 \times 10^{15}$ cm$^{-2}$ are injected, using the polysilicon films 158A, 158B and silicide film 153A as masks by the nearly vertical ion implantation method, and by heat treatment at about 900 deg.C. A third semiconductor region 220A of n+ type material (as a part of the source) and a fourth semiconductor region 220B of n+ type material (as a part of the drain) are formed in the p-type semiconductor layer 100. At this time, in the drain edge part, an n-type semiconductor region 200D (to be substantially used as a drain) is left over. In addition, an n-type semiconductor (to be substantially used as a source) is left over simultaneously.

Figure 8E:
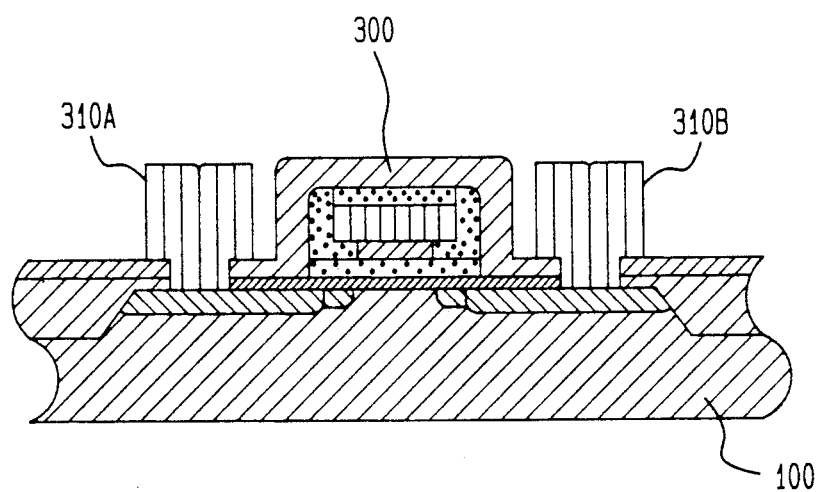
Figure 9A:
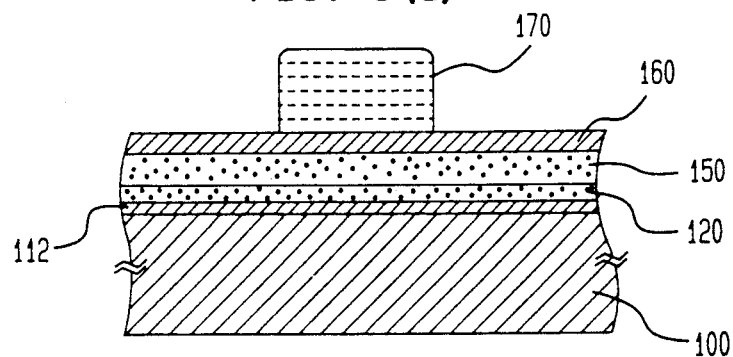
FIGS. 9a-9d are a process sectional view showing a method of manufacturing a MOS transistor in the prior art.
Figure 9B:
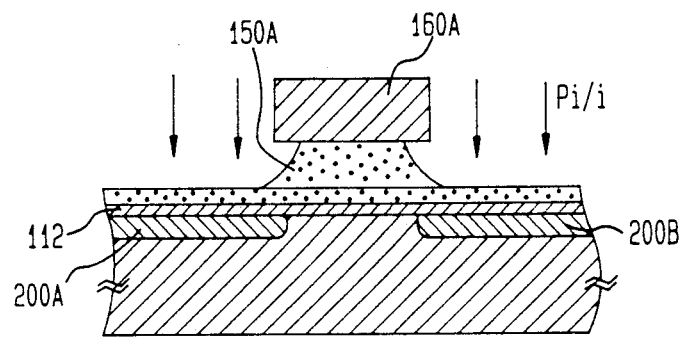
Figure 9C:
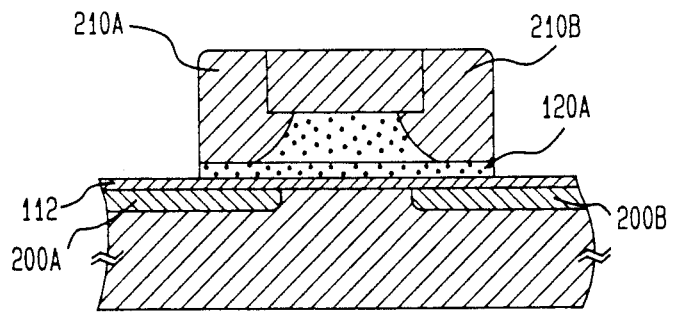
Figure 9D:
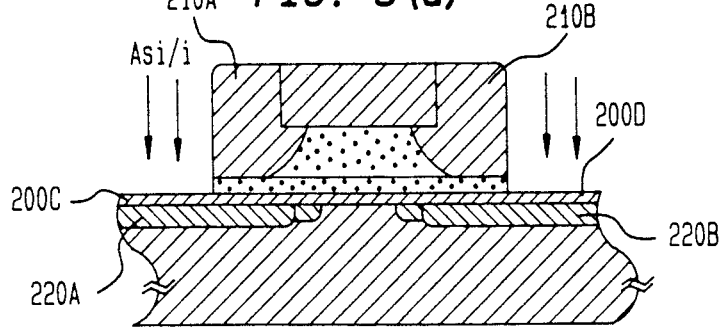

As shown in FIG. 8(e), after depositing a silicon oxide film 300 for insulation on the entire surface, contact openings of source, drain and others are formed by the conventional manufacturing method. In addition, a source is formed from an aluminum metal electrode 310A, and a drain is formed from an aluminum metal electrode 310B.

The MOS transistor manufactured by this process has the n-type semiconductor region 200D in the drain end part causing sufficient overlapping of the gate electrode polysilicon pattern 120A, so that the electric field applied to the drain end is smaller than in the MOS device formed by the conventional method. Thus, generation of a hot carrier in the drain end is suppressed, and a device of an excellent reliability (lifetime) is obtained. Aside from tungsten silicide film, metal compounds such as tungsten, molybdenum, molybdenum silicide and other metal silicides may be used, as the metallic conductive film 153 of the upper layer to the polysilicon film 120 of the first conductive film, thus lowering the wiring resistance of the gate. Furthermore, since the thickness of the insulation film 140 may be large, it is possible to lessen the stress due to the difference in the coefficient of thermal expansion between the metal compound 153 (such as tungsten silicide and metal silicide as the metallic conductive film of the upper layer) and the polysilicon film 120 (as the first conductive film). In addition, due to the presence of the insulation film 140, the first conductive film 120 and the metallic conductive film 153 do not make direct contact. Thus, stress-derived failure may be prevented, and reactive breakdown (gate puncture) of the gate oxide film 112 may be prevented. This effect is caused by thermal diffusion of the metal atoms from the metal compounds 153 used as the metallic conductive film of the upper layer into the polysilicon film 120, used as the first conductive film. In particular, when a titanium compound which is preferable for lowering the gate resistance is used as the metallic conductive film 153, breakdown of the gate oxide film 112 is likely to occur. However a greater effect is obtained by using an intervening insulation film as in this invention.

Moreover, by the improvement of the structure of the gate electrode, the following effects are obtained.

(1) By the overhang of the metallic conductive 153A over the insulation film 140A and the electrical connection of the upper surface of the first conductive film 120A and lower surface of metallic conductive film 153A through the remaining third conductive films 158A, 158B, conduction is securely achieved between the first conductive film 120A and the metallic conductive film 153A. In addition, the contact area between the third conductive film and the first conductive film (or the metallic conductive film) may be increased, and the electric resistance due to the third conductive film is held low.

(2) Owing to the presence of the insulation film, since the first conductive film and the metallic conductive film do not directly make contact with each other, it is possible to prevent generation of an interface level in the silicon semiconductor layer due to the stress between the films or breakdown of the gate oxide (so-called gate puncture) due to this stress. In other words, it is possible to prevent reactive breakdown of the gate oxide film caused by thermal diffusion of metal atoms (such as tungsten) from the metal compound (such as tungsten silicide) of the metallic conductive film used as the upper layer, into the polysilicon film which is used as the first conductive film, by the presence of the insulation film. At the time of this heat treatment, by thermal diffusion of metal atoms such as tungsten by priority to the polysilicon film which is the second conductive layer of the upper layer having a wide contact area with the metallic conductive film, it is possible to decrease the diffusion of metal atoms into the first conductive film of the lower layer. Further, by using the same material (polysilicon) as the first conductive film in the second conductive film formed on the tungsten silicide film which is a metallic conductive film, the stress generated from the metallic conductive film held between the first conductive film and second conductive film may be decreased on the substrate, thus resulting in the preferable effect of an enhanced production yield.

The actions obtained by the means of the methods disclosed in the foregoing series of embodiments of the invention are summarized below.

(1) Since the thickness of the insulation film may be large, etching of the second conductive film of the upper layer may be easily done.

(2) Electrical connection between the second conductive film in the upper layer and the first conductive film in the lower layer may be easily achieved through a third conductive film. When a material of low resistance is used as the second conductive film of the upper layer, it is not necessarily to lower the electric resistance of the first conductive film of the lower layer and the third conductive film in a gate having an insulation film such as MOS.

(3) Since the thickness of the insulation film may be sufficiently large, even by anisotropic dry etching of poor etching selectivity, etching of the second conductive film of the upper layer is easy, and a gate electrode with an excellent coverage shape and small electric resistance may be obtained without thinning the pattern.

(4) Since the combination of the first conductive film and second conductive film can be freely selected, the second conductive film of the upper layer may be made of (aside from polycrystalline semiconductor films of polysilicon, amorphous silicon, etc.), a polycrystalline material, a metallic conductive film (including tungsten, molybdenum and other metallic films), metal silicides (such as tungsten silicide and molybdenum silicide), and other high melting metals and metal compounds. Thus, the wiring resistance of the gate may be lowered. By using high melting metals, the machining temperature in the manufacturing process may be increased, with few restrictions.

(5) Since the thickness of the film may be relatively large, in particular as the second conductive film of the upper layer, when metal films (such as tungsten and molybdenum), metal silicides (such as tungsten silicide and molybdenum silicide), and other metal compound are used, the stress caused by the difference in the coefficient of thermal expansion between the second conductive film of the upper layer and the first conductive layer may decrease.

(6) When a conductive film is used as an etching inhibitor film, the gate electrode may have a lowered resistance. For example, titanium nitride and other materials, or semiconductor films such as germanium and gallium-arsenide may be used depending on the situation.

(7) When the second semiconductor region of the second conductive type as the drain is formed by oblique direction ion implantation method the gate and drain overlap easily. This method includes an implantation angle of 10 degrees or more from the reference plane, assuming that the plane vertical to the principal plane of the monocrystalline semiconductor substrate is a reference plane of 0 degree. Thus, the thickness of the third conductive film left over for controlling this overlap amount may be reduced. In addition, the gate length and gate capacity of the polysilicon gate electrode (the first conductive film) may be reduced, so that the degree of integration and performance of the MOS transistor may be improved.

(8) By forming the second semiconductor region of the second conductive type as the drain by oblique direction ion implantation method and the first semiconductor region of the second conductive type as the source by nearly vertical ion implantation method, the first semiconductor region as the source may be formed in a small size. This may occur by an implantation angle of less than 10 degrees from the reference plane vertical to the principal plane of the mioncrystalline semiconductor substrate. Thus, an excellent MOS transistor with small source resistance is obtained.

(9) By the overhang of the second conductive film over the insulation film, and electric connection of the upper surface of the first conductive film with at least the lower surface of the second conductive film by means of the third conductive layer that has been left over, the conduction between the first conductive film and the second conductive film may be securely achieved. In this case, it is not essential to connect with the third conductive film on the side surface of the second conductive film. However when connected also on the side surface, the contact area of the third conductive film with the first conductive film or the second conductive film may be increased, and the electric resistance due to the third conductive film may be further reduced.

(10) Owing to the presence of the insulation film, since the first conductive film and second conductive film do not make direct contact, generation of interface level in the silicon semiconductor layer due to interfilm stress or breakdown of the gate oxide (so-called gate puncture) due to this stress may be prevented. It is also possible to prevent reactive breakdown of the gate oxide film caused by thermal diffusion of metal atoms (such as tungsten) from the metal compound (such as tungsten silicide and other metal silicides) into the polysilicon films as the first conductive film.

We claim:

1. A field effect semiconductor device comprising a first insulation film for a gate formed on a semiconductor layer of a first conductive type, a first conductive film to be a gate electrode formed on the insulation film for gate, a further insulation film formed in a width not projecting out from above the first conductive film, a second conductive film formed on the further insulation film, a first semiconductor region of a second conductive type as source and a second semiconductor region of the second conductive type as drain disposed in the semiconductor layer of the first conductive type immediately beneath the edge part of the first conductive film as a gate electrode by ion implantation method using the second conductive film as mask, a third conductive film selectively left over on the side surface of the second conductive film and the side surface of the further insulation film, and a third semiconductor region of the second conductive type as part of the source and a fourth semiconductor region of the second conductive type as part of the drain disposed at the source side and drain side in the semiconductor layer of the first conductive type, wherein the space region between the second conductor region of the second conductive type as drain and the first semiconductor region of the second conductive type as source is used as a channel part, the upper surface of the first conductive film and the side surface of the second conductive film are electrically connected by way of the third conductive film, and is arranged so that the width of the first conductive film may nearly coincide with the sum of the width of the second conductive film and the width of the third conductive films left over at both sides of the second conductive film.

2. The field effect semiconductor device of claim 1, wherein a conductive film is used as the further insulation film to lower the resistance of the gate electrode.

3. A field effect semiconductor device comprising a first insulation film for a gate formed on a semiconductor layer of a first conductive type, a first conductive film as a gate electrode formed on the insulation film for gate, a further insulation film formed in a width not projecting out from above the first conductive film, a second conductive film formed on the further insulation film and overhanging on the further insulation film, a first semiconductor region of a second conductive type as a source and a second conductive region of the second conductive type as a drain formed, in the semiconductor layer of the first conductive type immediately beneath the edge part of the first conductive film as the gate electrode, by an ion implantation method using the second conductive film as the mask, a third conductive film selectively left over at least on the lower surface of the second conductive film, the side surface of the further insulation film and the upper surface of the first conductive film, and a third semiconductor region of the second conductive type as a part of the source and a fourth semiconductor region of the second conductive type as a part of the drain disposed at the source side and drain side in the semiconductor layer of the first conductive type, by an ion implantation method using the remaining third conductive film and the second conductive film as masks, wherein the space region between the second semiconductor region of the second conductive type as drain and the first semiconductor region of the second conductive type as source is used as a channel part, the upper part of the first conductive film and the lower surface of the second conductive film are electrically connected by way of the third conductive film, and it is arranged so that the width of the first conductive film may nearly coincide with the sum of the width of the second conductive film and the width of the third conductive films left over at both sides of the second conductive film.

4. A field effect semiconductor device comprising a first insulation film for a gate formed on a semiconductor layer of a first conductive type, a conductive film made of a first polycrystalline semiconductor to be a gate electrode formed on the insulation film for gate, a further insulation film of wiring shape formed in a width not exceeding from above the first conductive film, a metallic conductive film of wiring shape formed on the further insulation film and overhanging on the further insulation film, a conductive film made of a second polycrystalline semiconductor formed on the metallic conductive film, a first semiconductor region of a second conductive type to be a source and a second semiconductor region of the second conductive type to be a drain being disposed in the semiconductor layer of the first conductive type immediately beneath the edge part of the gate electrode by an ion implantation method using the metallic conductive film as a mask, a conductive film made of a third polycrystalline semiconductor selectively left over at least on the lower surface of the metallic conductive film, the side surface of the further insulation film and the upper surface of the first conductive film, and a third semiconductor region of a second conductive type as a part of the source and a fourth semiconductor region of the second conductive type as a part of the drain disposed at the source side and drain side in the semiconductor layer of the first conductive type, by an ion implantation method using the remaining third conductive film and metallic conductive film as masks, wherein the space region between the second semiconductor region of the second conductive type as drain and the first semiconductor region of the second conductive type as source is used as a channel part, the upper part of the first conductive film and the lower surface of the metallic conductive film of wiring shape are electrically connected by way of the third conductive film, and is arranged so that the width of the first conductive film may nearly coincide with the sum of the width of the metallic conductive film of wiring shape and the width of the third conductive films left over at both sides of the metallic conductive film.

5. A method of manufacturing field effect semiconductor devices comprising a step of forming a first insulation film for a gate on a semiconductor layer of a first conductive type, a step of forming a first conductive film as gate electrode on the insulation film for the gate, a step of forming a further insulation film on the first conductive film, a step of forming a second conductive film on the further insulation film, a step of etching the second conductive film by using the further insulation film as an etching inhibitor, a step of forming a first semiconductor region of a second conductive type as source and a second semiconductor region of the second conductive type as drain, by penetrating impurities of the second conductive type by the ion implantation method using the second conductive film as mask, hereby implanting immediately beneath the edge part of the planned gate electrode forming area of the source side and drain side in the semiconductor layer of the first conductive type, a step of connecting the upper surface of the first conductive film and the side surface of the second conductive film through a third conductive film, while leaving the third conductive and the side surface of the etched further insulation film, a step of forming the first conductive film into the shape of a wire by using the remaining third conductive film and the second conductive film as etching masks, and a step of forming a third semiconductor region of the second conductive type as a part of source and a fourth semiconductor region of the second conductive type as a part of a drain by implanting impurities of the second conductive type into the source side and drain side in the semiconductor layer of the first conductive type, by the ion implantation method using the remaining third conductive layer and the second conductive film as masks, wherein the space region between the second semiconductor region of the second conductive type as the drain and the first semiconductor region of the second conductive type as the source is used as the channel area, and the upper surface of the first conductive film and the side surface of the second conductive film of wiring shape are electrically connected through the remaining third conductive film.

6. The method of claim 5, wherein a conductive film is used as the further insulation film for etching inhibitor, thereby lowering the resistance of the gate electrode.

7. A method of manufacturing field effect semiconductor devices comprising a step of forming a first insulation film for a gate on a semiconductor layer of a first conductive type, a step of forming a first conductive film as a gate electrode on the insulation film for gate, a step of forming a further insulation film on the first conductive film, a step of forming a second conductive film on the further insulation film, a step of etching the second conductive film and the further insulation film into the shape of a wire, a step of overhanging the second conductive film on the further insulation film, a step of forming a first semiconductor region of a second conductive type as a source and a second semiconductor region of the second conductive type as a drain, by implanting an impurity of the second conductive type immediately beneath the edge part of the planned gate electrode at the source side and drain side in the semiconductor layer of the first conductive type by an ion implantation method using the second conductive film as a mask, a step of connecting the upper surface of the first conductive film and the lower surface of the second conductive film through a third conductive film, by leaving the third conductive film at least on the lower surface of the overhung second conductive film and the side surface of the etched further insulation film, a step of forming the first conductive film into the shape of a wire by using the remaining third conductive film and second conductive film as etching masks, and a step of forming a third semiconductor region of a second conductive type as a part of the source and a fourth semiconductor region of the second semiconductor type as a part of the drain, by implanting an impurity of the second conductor type into the source side and drain side in the semiconductor layer of the first conductive type by an ion implantation method using the remaining third conductive film and the second conductive film as masks, wherein the space between the second semiconductor region of the second conductive type as the drain and the first semiconductor region of the second conductive type as the source is used as the channel area, and the upper surface of the first conductive film and the lower surface of the second conductive film are electrically connected through the remaining third conductive film.

8. A method of manufacturing field effect semiconductor devices comprising a step of forming a first insulation film for a gate on a semiconductor layer of a first conductive type, a step of forming a first conductive film as a gate electrode on the insulation film for the gate, a step of forming a further insulation film on the first conductive film, a step of forming a metallic conductive film on the further insulation film, a step of forming a second conductive film on the metallic conductive film, a step of etching the second conductive film, metallic conductive film and the further insulation film into the shape of a wire, a step of overhanging the metallic conductive film on the further insulation film, a step of forming a first semiconductor region of a second conductive type as a source and a second semiconductor region of the second conductive type as a drain, by implanting an impurity of the second conductive type immediately beneath the planned gate electrode edge part of the source side and drain side in the semiconductor layer of the first conductive type by an ion implantation method using the metallic conductive film as a mask, a step of connecting the upper surface of the first conductive film and the lower surface of the metallic conductive film through a third conductive film by leaving the third conductive film at least on the lower surface of the overhung metallic conductive film and the side surface of the etched further insulation film, a step of forming the first conductive film into the shape of a wire by using the remaining third conductive film and the metallic conductive film as etching masks, and a step of forming a third semiconductor region of the second conductive type as a part of the source and a fourth semiconductor region of the second conductive type as a part of the drain, by implanting an impurity of the second conductive type into the source side and drain side in the semiconductor layer of the first conductive type by an ion implantation method using the remaining third conductive film and the metallic conductive film of wiring shape as masks, wherein the space between the second semiconductor region of the second conductive type as the drain and the first semiconductor region of the second conductive type as the source is used as the channel area, and the upper surface of the first conductive film and the lower surface of the metallic conductive film are electrically connected through the remaining third conductive film.

9. A method of manufacturing field effect semiconductor devices comprising a step of forming a first insulation film for a gate on a semiconductor layer of a first conductive type, a step of forming a first conductive film as a gate electrode on the insulation film for the gate, a step of forming a further insulation film on the first conductive film, a step of forming a second conductive film on the further insulation film, a step of etching the second conductive film into the shape of a wire by using the further insulation film as an etching inhibitor, a step of etching the further insulation film into the shape of a wire, a step of forming a first semiconductor region of a second conductive type as a source by implanting an impurity of the second conductive type immediately beneath the edge part of the planned gate electrode at the source side in the semiconductor layer of the first conductive type by an ion implantation method using the second conductive film as a mask, a step of forming a second semiconductor region of the second conductive type as a drain by implanting the impurity of the second conductive type immediately beneath the edge part of the planned gate electrode of the drain side in the semiconductor layer of the first conductive type by an oblique direction ion implantation method using the etched second conductive film as a mask, a step of connecting the upper surface of the first conductive film and the side surface of the second conductive film through a third conductive film by leaving the third conductive film on the side surface of the second conductive film and the side surface of the etched further insulation film after forming the first and second semiconductor regions, a step of forming the first conductive film into the shape of a wire by using the remaining third conductive film and the second conductive film as etching masks, and a step of forming a third semiconductor region of the second conductive type as a part of the source and a fourth semiconductor region of the second conductive type as a part of the drain, by implanting the impurity of the second conductive type into the source side and drain side in the semiconductor layer of the first conductive type by an ion implantation method using the remaining third conductive film and the second conductive film as masks, wherein the space between the second semiconductor region of the second conductive type as the drain and the first semiconductor region of the second conductive type as the source is used as the channel area, and the upper surface of the first conductive film and the second conductive film are electrically connected through the remaining third conductive film.

10. The method of claim 9, wherein the step of forming the first semiconductor region of the second conductive type as the source is characterized by forming the first semiconductor region of the second conductive type as the source by implanting the impurity of the second conductive type into the edge part of the planned gate electrode of the source side in the semiconductor layer of the first conductive type by nearly vertical ion implantation method using the second conductive film as a mask.

11. The method of claim 5, wherein the ion implantation for forming the source or drain is characterized as preventing the channeling of implanted ions by using an amorphous semiconductor film as the first conductive film.

12. The method of claim 6, wherein the ion implantation for forming the source or drain is characterized as preventing the channeling of implanted ions by using an amorphous semiconductor film as the first conductive film.

13. The method of claim 6, wherein the ion implantation for forming the source or drain is characterized as preventing the channeling of implanted ions by using an amorphous semiconductor film as the first conductive film.

14. The method of claim 7, wherein the ion implantation for forming the source or drain is characterized as preventing the channeling of implanted ions by using an amorphous semiconductor film as the first conductive film.

15. The method of claim 8, wherein the ion implantation for forming the source or drain is characterized as preventing the channeling of implanted ions by using an amorphous semiconductor film as the first conductive film.

16. The method of claim 9, wherein the ion implantation for forming the source or drain is characterized as preventing the channeling of implanted ions by using an amorphous semiconductor film as the first conductive film.

17. The method of claim 10, wherein the ion implantation for forming the source or drain is characterized as preventing the channeling of implanted ions by using an amorphous semiconductor film as the first conductive film.

18. The method of claim 9, wherein the second conductive film overhangs on the further insulation film so as to connect electrically through the third conductive film left over on the upper surface of the first conductive film and at least the lower surface of the second conductive film.

* * * * *